(12) United States Patent
Schnell et al.

(10) Patent No.: US 7,761,070 B2
(45) Date of Patent: Jul. 20, 2010

(54) AMPLIFIER DEVICE FOR AN ANTENNA OPERABLE IN AT LEAST ONE MODE

(75) Inventors: Wilfried Schnell, Forchheim (DE); Markus Vester, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 467 days.

(21) Appl. No.: 11/766,833

(22) Filed: Jun. 22, 2007

(65) Prior Publication Data

US 2008/0197922 A1 Aug. 21, 2008

(30) Foreign Application Priority Data

Jun. 22, 2006 (DE) ........................ 10 2006 028 690

(51) Int. Cl.
*H04Q 11/12* (2006.01)
*H04B 1/06* (2006.01)
(52) U.S. Cl. ................. 455/193.1; 455/121; 455/253.2
(58) Field of Classification Search ................. 455/561, 455/562.1, 121, 193.1, 253.2, 341; 330/124 R, 330/126
See application file for complete search history.

(56) References Cited

U.S. PATENT DOCUMENTS

| | | | | |
|---|---|---|---|---|
| 5,790,517 A | * | 8/1998 | Meredith | .................... 370/210 |
| 6,381,212 B1 | * | 4/2002 | Larkin | ........................ 370/210 |
| 6,803,837 B2 | * | 10/2004 | Ishida et al. | ................. 333/128 |
| 6,977,502 B1 | * | 12/2005 | Hertz | ........................ 324/318 |
| 7,012,970 B2 | * | 3/2006 | Greenwood et al. | ......... 375/296 |
| 7,020,215 B2 | * | 3/2006 | Porco et al. | ................. 375/297 |
| 7,119,733 B2 | | 10/2006 | Schoebert et al. | |
| 2003/0062894 A1 | | 4/2003 | Vester | |

FOREIGN PATENT DOCUMENTS

EP 1 314 223 4/2006

* cited by examiner

*Primary Examiner*—Sonny Trinh
(74) *Attorney, Agent, or Firm*—Schiff Hardin LLP

(57) ABSTRACT

An amplifier device for a mode antenna has a number of amplifiers and a number of outputs. An input signal is fed to each amplifier, which is amplified by the respective amplifier into an amplified input signal. The amplified input signals are fed to an output matrix arranged after the amplifiers. Respective output signals are emitted by the output matrix at the outputs. The output matrix causes each amplified input signal to supply an output signal contribution for each output signal. Each output signal contribution of each output signal has an output-side contribution offset in relation to the corresponding amplified input signal, which depends on the amplified input signal that supplied the output signal contribution, and the output signal to which the output signal contribution contributes. The amplifier device is especially able to be used in a transmit arrangement for radio-frequency signals.

20 Claims, 4 Drawing Sheets in the case of:
$e_i = e \sin(2\pi ft - \varphi_i)$,
when only 1 of $u_1...u_l \neq 0$ In the case of:
$S_k = S \cdot \sin(2\pi f t - \varphi_k)$,
when only 1 of $A_1 \ldots A_m \neq 0$

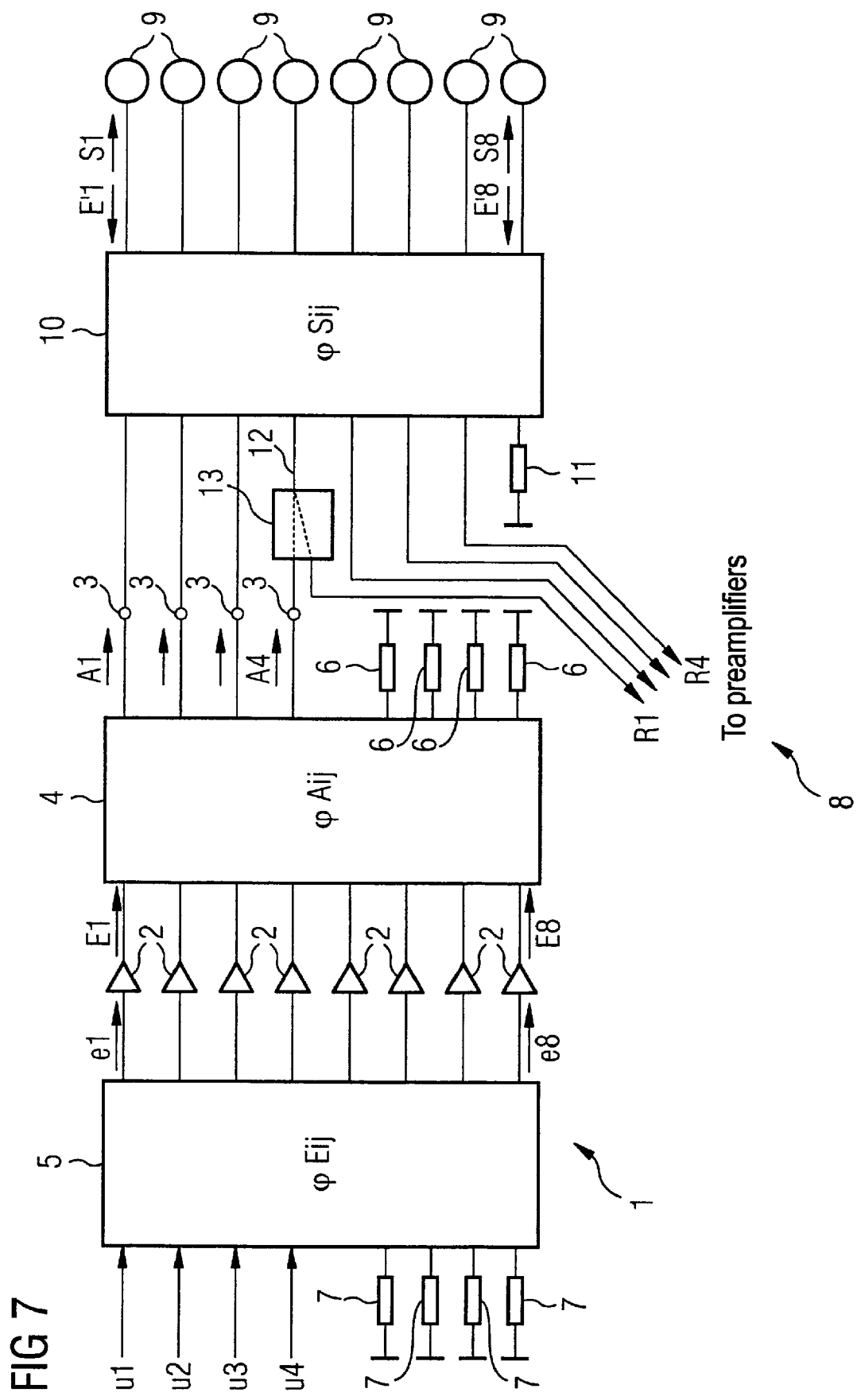

AMPLIFIER DEVICE FOR AN ANTENNA OPERABLE IN AT LEAST ONE MODE

BACKGROUND OF THE INVENTION

1. Field of the Invention

The present invention relates to an amplifier device with a number of amplifiers and a number of outputs.

2. Description of the Prior Art

Amplifiers of the above type are generally known. They are used, for example, in radio-frequency transmit devices (e.g. radar antennas or magnetic resonance antennas).

Radio-frequency transmit devices often include a number of transmit antennas which interact with each other. Each transmit antenna is fed with a transmit signal with the correspondingly transmitted signals being overlaid with the transmit signal—depending on the area of application—in the near field or in the far field. With magnetic resonance antennas for example the spatial distribution of the so-called B1 radio-frequency field can be adjusted by means of the overlaying of the individual signals that are emitted. With radar systems the directional characteristic of the emitted signals can be influenced by means of the overlaying of the emitted signals.

The generation of a suitable small signal (subsequently called an input signal) for each individual transmit antenna, supply of each input signal to an amplifier and feeding of the amplified input signals to the transmit antenna as transmit signals is known. The procedure has a number of disadvantages. Thus, for example, the transmit antennas are not decoupled from each other. Thus strong feedback at the amplifiers generally occurs which the amplifiers must overcome.

Operation of the antennas in Eigen modes is also known. In this case mode signals are created which are characteristic of the strength with which the transmit antennas in their entirety are to be operated in the relevant mode.

The modes are—at least in theory—orthogonal to each other, so that no feedback occurs. Even in practice often only slight feedback occurs.

The power consumption of the individual modes as a rule varies greatly from mode to mode. If equal size amplifiers are used to amplify the mode signals, all amplifiers must be dimensioned for the maximum power, so that the amplifier device overall is over-dimensioned and consequently expensive. If amplifiers of different powers are used, the amplifier device has a greater type diversity of amplifiers, which in particular makes keeping spare parts and repair more expensive.

SUMMARY OF THE INVENTION

An object of the present invention is to provide an amplifier device with which mode signals can be amplified with a number of amplifiers in a simple manner, without needing a complicated circuit structure.

This object is achieved in accordance with the invention by an amplifier device having a number of amplifiers wherein an input signal is fed to each amplifier, each amplifier thereby producing an amplified input signal. The amplified input signals are fed to an output matrix connected after the amplifier. A number of output signals are able to be output by the output matrix. Each output signal is output via one of the outputs. The output matrix causes each amplified input signal to supply an output signal contribution for each output signal. Each output signal contribution of each output signal has an output-side contribution phase offset in relation to the corresponding amplified input signal, which depends on the amplified input signal from which the output signal contribution was supplied and on the output signal to which the output signal contribution contributes.

In accordance with the inventive embodiment of the amplifier device, each amplifier makes a contribution to each mode, namely the respective output signal contribution.

The output-side contribution phase offsets in principle can be determined in any way. Preferably they fulfill the following condition: If, as is typical, the amplified input signals are sinusoidal alternating signals that have a uniform amplitude, a uniform frequency and have signal phase offsets relative to each other, which compensate for one of the output signals for the corresponding output-side contribution phase offset, the contributions of the other output signals compensate for each other in total. In this case only one output signal is output, for which the output-side contribution phase offsets are compensated. The other output signals have the value zero. If this condition is fulfilled, the output signal concerned is orthogonal to the other output signals.

Preferably the output-side contribution phase offsets are determined so that it can be freely determined by the signal phase offsets which of the output signals is the one output signal. In this case it can be defined by corresponding determination of the signal phase offsets which of the output signals differs from zero. All other output signals (except for the one output signal) are in this case zero. The output matrix with this type of embodiment executes an orthogonal transformation of the amplified input signal.

Preferably an input matrix is arranged before the amplifiers, to which a number of source signals are able to be fed and from which the input signals can be output. The input matrix is in this case embodied such that each origin signal delivers an input signal contribution for each input signal. Each input signal contribution of each input signal in this case has an input-side contribution phase offset in relation to the corresponding origin signal, which depends on the origin signal from which the input signal contribution is supplied and on the input signal to which the input signal contribution contributes. The input signals can be created in an especially simple manner by means of the input matrix, its embodiment and its circuit.

The input-side contribution phase offsets are preferably de-fined such that, with the prerequisite that one of the origin signals is a sinusoidal alternating signal and the other origin signals have the value zero, the input signals have a uniform amplitude and relative to each other have signal phase offsets which are defined such that for one of the output signals they compensate for the corresponding output-side contribution phase offsets. Preferably it can even be freely defined which of the original signals is the one origin signal. Through this process an orthogonal transformation of the origin signal can be undertaken in the input signals. After the amplification of the input signals the amplified input signals can be transformed back again by orthogonal transformation. Each output signal corresponds in this case to one of the origin signals.

The input matrix and the output matrix are preferably structured in the same way. This structure simplifies the overall structure of the amplifier device.

It is possible for all inputs of the input matrix to be used. Alternatively it is possible for the input matrix to have more inputs than there are origin signals able to be fed to it. In this case inputs not used for feeding the origin signals are preferably terminated using resistors, of which the resistance value corresponds to the surge impedance of the inputs.

In a similar manner it is possible to output an output signal over each output of the output matrix. Alternatively, it is possible for the output matrix to have more outputs than there are output signals which it can output. In this case outputs not used for outputting the output signals are preferably terminated using resistors, of which the resistance value corresponds to the surge impedance of the outputs.

The amplifiers preferably have identical amplifier characteristics. The amplifier characteristics can especially be the amplification, the frequency response and the maximum deliverable power of the amplifier. In particular they can be of the same design or type.

The inventive amplifier device can be used especially in a transmit arrangement for radio frequency signals, which in addition to the inventive amplifier device features an antenna matrix and a number of transmit antennas. In this case at least a part of the output signals is able to be fed to the antenna matrix. A number of transmit signals are able to be issued by the antenna matrix, with each send signal being able to be fed to one of the transmit antennas. The antenna matrix is embodied such that each output signal fed to the antenna matrix supplies a transmit signal contribution to each transmit signal. Each transmit signal contribution of each transmit signal has a transmit-side contribution phase offset in relation to the corresponding output signal, which depends on the output signal by which the transmit signal contribution was supplied and on the transmit signal to which the transmit signal contribution contributes.

The transmit-side contribution phase offsets are preferably defined so that, with the prerequisite that one of the output signals is a sinusoidal alternating signal and the other out-put signal has the value zero, the transmit signals have a uniform amplitude.

Preferably the antenna matrix and the output matrix are embodied the same. This simplifies the overall design of the transmit arrangement.

Each input of the antenna matrix can be used for feeding an output signal. Alternatively it is possible for the antenna matrix to have more inputs than there are output signals which are able to be fed to it.

In a similar way to the inputs of the input matrix and the outputs of the output matrix it is possible for at least one of the inputs of the antenna matrix not used for feeding the output signals to be terminated via a resistor. If the transmit arrangement is used exclusively for transmitting radio frequency signals, this is as a rule the case with all inputs not used to feed the output signals.

Reception signals can be received by the transmit antennas, as reception signals to be fed from the transmit antennas to the antenna matrix conveyance are for a number of response signals to be issued by the antenna matrix.

The output of the response signals and the feeding of the output signals can occur in separate areas of the antenna matrix. It is alternatively possible for at least one of the response signals to be output via one of the inputs of the antenna matrix. It is possible in this case for at least one of the response signals to be able to be output via one of the inputs not used for feeding the output signals. This input is in this case not terminated via a resistor.

As an alternative or in addition at least one of the response signals is able to be output via one of the inputs used for feeding the output signals.

The output signals fed to the antenna matrix are able to be fed to the antenna matrix via lines. A signal switch is preferably arranged in the line by which both one of the output signals and also one of the response signals is able to be routed, through which the response signal concerned can be injected out of the line.

The transmit arrangement can especially be used with magnetic resonance systems. In this case the transmit antennas are embodied to transmit the magnetic resonance excitation signals.

BRIEF DESCRIPTION OF THE DRAWINGS

FIG. 7 schematically illustrates a further embodiment of a transmit arrangement embodying an amplifier device in accordance with the present invention.

DESCRIPTION OF THE PREFERRED EMBODIMENTS

Figure 1:
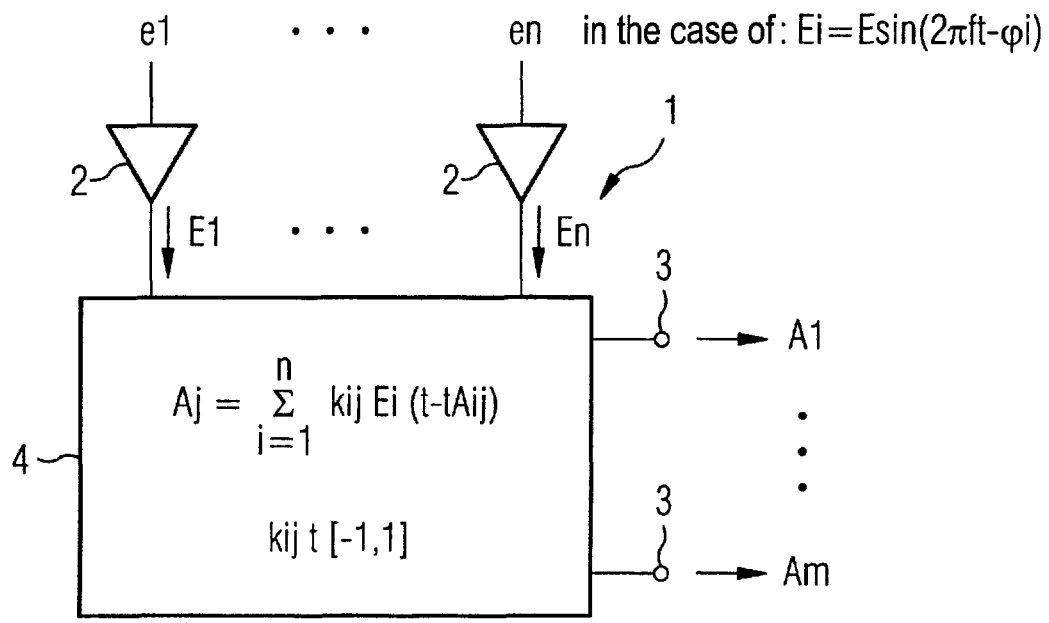
FIG. 1 is a block diagram schematically illustrating an amplifier device constructed and operating in accordance with the present invention.

In accordance with FIG. 1 an amplifier device 1 has a number of amplifiers 2 and a number of outputs 3. The outputs 3 are connected to the amplifier 2 via an output matrix 4.

Amplifiers 2 preferably feature the same amplifier characteristics as each other. The following aspects in particular are identical:

A gain with which the amplifiers 2 amplify input signals e1 ... en into amplified input signals E1 ... En, A frequency response exhibited by the amplifiers 2, and a maximum limit power which the amplifiers 2 can deliver.

To this end the amplifiers 2 can especially be of the same de-sign or the same type.

An input signal e1 ... en is fed to each amplifier 2, which is amplified by the respective amplifier 2 into an amplified input signal E1 ... En. The amplified input signals E1 ... En are fed to the output matrix 4 which is arranged after the amplifier 2. A number of output signals A1 ... Am are emitted as outputs by the output matrix 4. Each output signal A1 ... Am is emitted via one of the outputs 3.

In accordance with FIG. 1 the output matrix 4 is configured to cause each amplified input signal E1 ... En to supply an output signal contribution to each output signal A1 ... Am. The size of the respective output signal contribution is determined by a weighting factor kij (l=1 ... n, j=1 ... m). The weighting factors kij are real and lie between −1 and +1. As a rule they lie around +1. The uniform selection of the value +1 for the weighting factors kij is however not mandatory.

As can further be seen from FIG. 1 each output signal contribution of each output signal A1 ... Am has a time offset tAij (l=1 ... n, j=1 ... m) in relation to the corresponding amplified input signal E1 ... En. The input signals e1 ... en and with them the amplified input signals E1 ... En usually have a uniform frequency f. The time offsets tAij thus correspond to the output-side contribution phase offsets φAij (l=1 ... n, j=1 ... m) in accordance with the equation $$\phi Aij = 2\pi ft Aij.$$

The output-side contribution phase offsets φAij depend on the amplified input signal E1 ... En by which the output signal contribution was supplied and on the output signal A1 ... Am to which the output signal contribution contributes. They can be the same for an individual signal of the amplified input signals E1 ... En. As an alternative or in addition they can be the same for an individual signal of the output signals A1 ... Am. For the other amplified input signals E1 ... En and for the other output signals A1 ... Am they are not the same.

It is assumed below that the amplified input signals E1 ... En are sinusoidal alternating signals which have a uniform amplitude E and a uniform frequency f. It is further assumed that the amplified input signals E1 ... En have signal phase off-sets φI relative to each other. The amplified input signals E1 ... En can thus be written as $$Ei = E \sin(2\pi ft - \phi I)$$

with I cycling through the values 1 ... n and t being the time.

For each individual signal of the output signals A1 ... Am the signal phase offsets φI can be determined so as to compensate for the output-side contribution phase offset φAij.

As to the other output signals A1 ... Am, in each case the signal phase offsets □I cannot compensate for the corresponding output side contribution phase offsets φAij. It is however possible to define the output-side contribution phase offsets φAij in such as way that, for the other output signals A1 ... Am, the output signal contributions of these signals compensate for each other as a whole. It is even possible for this compensation of the output signal contributions for the other output signals A1 ... Am to be possible independently of for which of the output signals A1 ... Am the signal phase offsets □I compensate for the corresponding output-side contribution phase offsets φAij.

Figure 2:
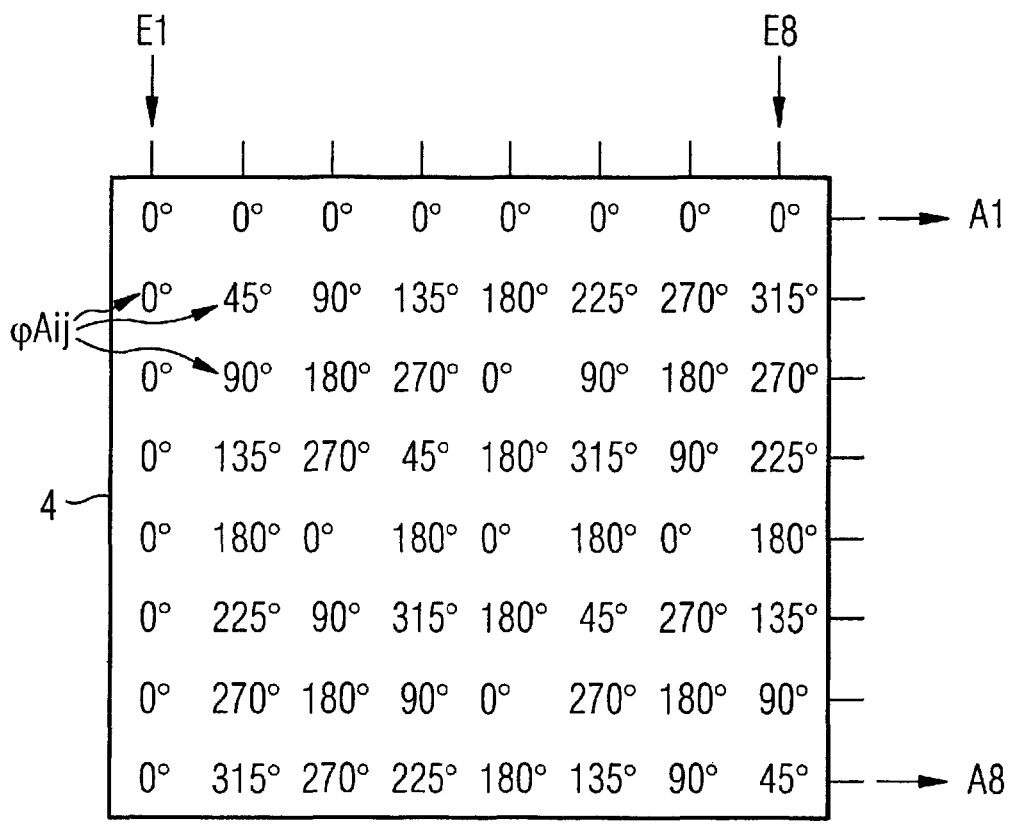
FIG. 2 schematically illustrates an output matrix for use in the amplifier device in accordance with the present invention.

The appropriate compensation is especially possible if the output matrix 4 performs an orthogonal transformation of the amplified input signals E1 ... En. A typical example of an orthogonal transformation is Fourier transformation. Especially in the case a Fourier transformation the output matrix 4 can be implemented for example as a so-called Butler matrix. FIG. 2 shows examples of the output-side contribution phase offsets φAij of a Butler matrix, to which eight amplified input signals E1 ... E8 can be fed and from which output signals A1 ... A8 can be emitted.

With the embodiment in accordance with FIG. 1 the input signals e1 ... en are determined such that through the overlaying of the corresponding amplified input signals E1 ... En only a single signal of the output signals A1 ... Am differs from zero. The generation of such input signals e1 ... en can be simplified with an embodiment as is subsequently explained in greater detail in connection with FIG. 3.

Figure 3:
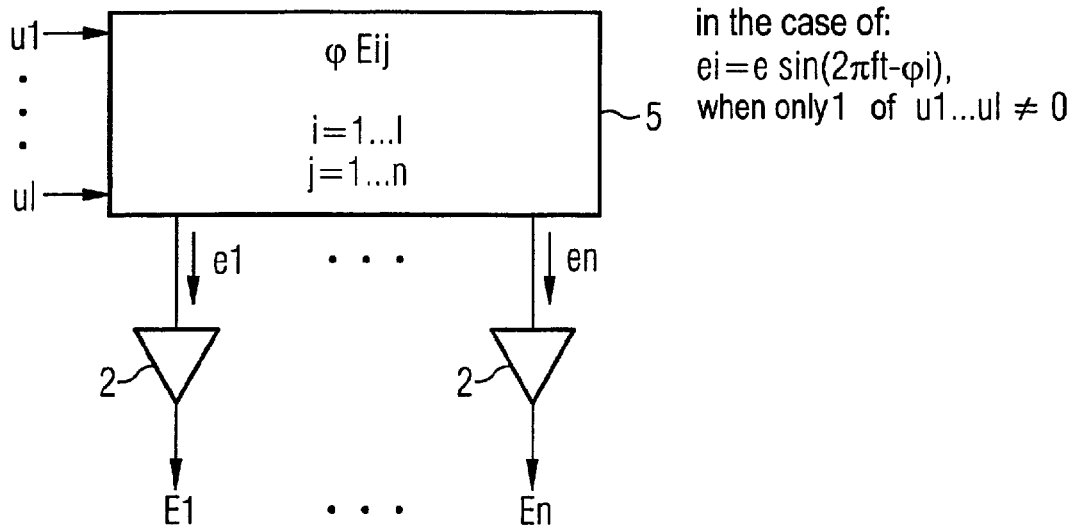
FIG. 3 schematically illustrates an embodiment of the amplifier device in accordance with the present invention for use with sinusoidal input signals.

In accordance with FIG. 3 an input matrix 5 is arranged before the amplifier 2. A number of original signals u1 ... ul are able to be fed to the input matrix. The input signals e1 ... en are emitted as outputs by the input matrix. The input matrix 5 is configured to cause each original signal u1 ... ul to supply to each input signal e1 ... en an input signal contribution. In a similar manner to the output matrix 4 each input signal contribution of each input signal e1 ... en has an input-side contribution phase offset in relation to the corresponding original signal u1 ... ul. φEij (l=1 ... l, j=1 ... n). The input-side contribution phase offset φEij depends on the original signal u1 ... ul by which the input signal contribution was supplied and on the input signal e1 ... en to which the input signal contribution contributes.

The input-side contribution phase offsets φEij can in principle be determined in any manner. Preferably they are determined as follows: If one of the original signals u1 ... ul is a sinusoidal alternating signal is and the other original signals u1 ... ul have the value zero, the input signals e1 ... en have a uniform amplitude e. The input signals e1 ... en furthermore have the signal phase offsets I described above in connection with the amplified input signals E1 ... En relative to one another □. By application of a sinusoidal alternating signal as one of the original signals u1 ... ul amplified input signals E1 ... En are thus generated which lead as a result to one of the output signals A1 ... Am differing from zero and to the other output signals A1 ... Am having the value zero.

Preferably the above statement then applies for each of the origin signals u1 ... ul. Each of the original signals u1 ... ul corresponds in this case to one of the output signals A1 ... Am. It is also freely-definable which of the original signals u1 ... ul is the one origin signal u1 ... ul.

Like the output matrix 4 the input matrix 5 thus preferably performs an orthogonal transformation of the original signals u1 ... ul fed to it. In particular the input matrix 5 can be structured in a similar way to the output matrix 4. It can however—by contrast with the output matrix 4—be dimensioned for small signals.

Figure 4:
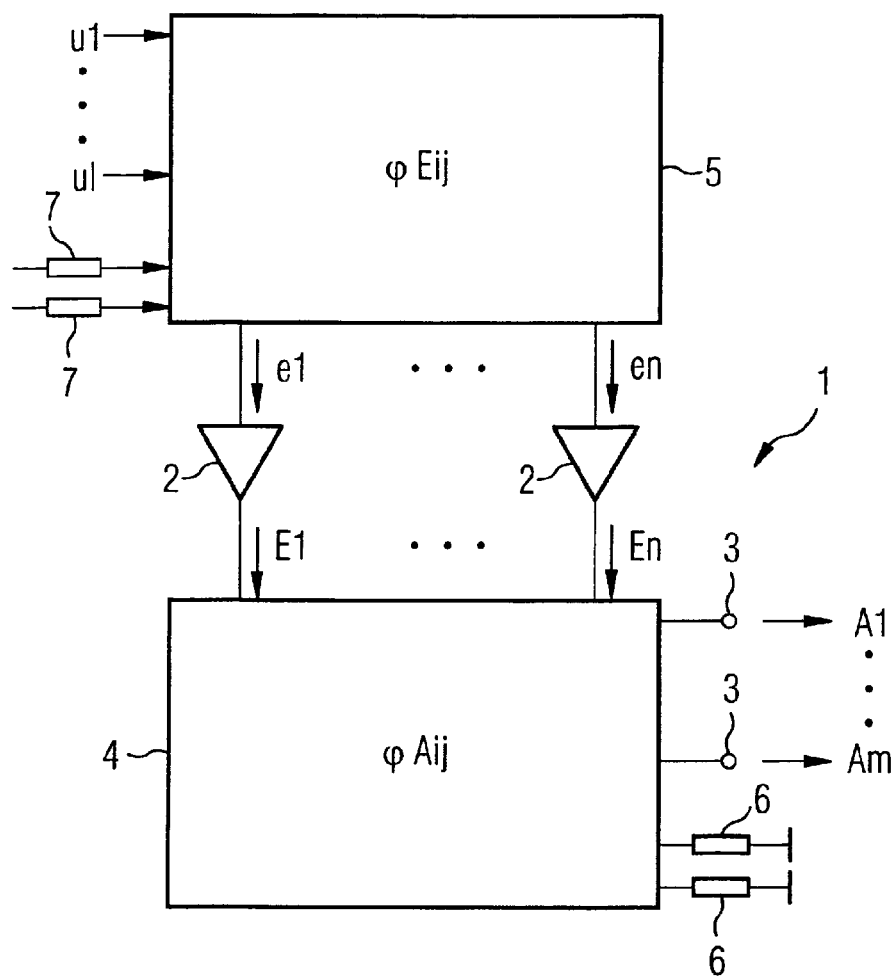
FIG. 4 schematically illustrates a further embodiment of the amplifier device in accordance with the invention, having an input matrix that precedes the amplifiers.

All modes are able to be created by means of the embodiment in accordance with FIG. 3. In many cases however it is known a priori that not all modes will be used. In this case it is possible in accordance with FIG. 4 for the output matrix 4 to have more outputs than the output signals A1 ... Am which it is able to output. The outputs not used for outputting the output signals A1 ... Am are in this case preferably terminated via resistors 6, the resistance value of which corresponds to the surge impedance of the outputs.

In a similar fashion it is possible for the input matrix 5 to have more inputs than original signals u1 ... ul which are able to be fed to it. In this case inputs u1 ... ul not used for feeding the original signals are preferably terminated using resistors 7, of which the resistance value corresponds to the surge impedance of the inputs.

Figure 5:
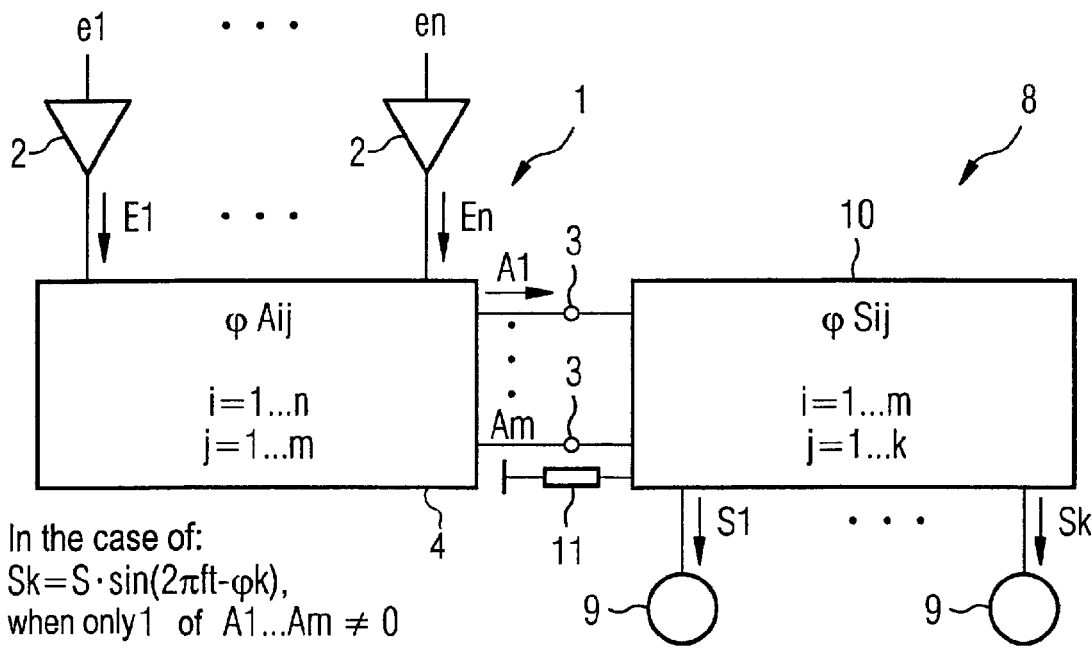
FIG. 5 schematically illustrates a transmit arrangement for radio-frequency signals embodying an amplifier device in accordance with the present invention.

The inventive amplifier device 1 is especially used for so-called mode antennas—often referred to in radar technology as phased arrays. A transmit arrangement 8 for radio frequency signals (e.g. radar or magnetic resonance signals) in this case in accordance with FIG. 5 features a number of transmit antennas 9 which are connected via an antenna matrix 10 to an inventive amplifier device 1. At least a part of the output signals A1 ... Am is able to be fed to the antenna matrix 10. A number of transmit signals S1 ... Sk are able to be output by the antenna matrix 10 Each transmit signal S1 ... Sk is able to be fed to one of the transmit antennas 9.

The antenna matrix 10 performs a distribution of the mode signals (i.e. of the output signals A1 ... Am) fed to it at the individual transmit antennas 9. The antenna matrix 10 is thus embodied such that each of the output signals A1 ... Am fed to the antenna matrix 10 supplies a transmit signal contribution to each transmit signal S1 ... Sk. Each transmit signal contribution of each transmit signal S1 ... Sk has a transmit-side contribution phase offset φSij in relation to the corresponding output signal A1 ... Am. Like the output matrix 4, the transmit-side contribution phase offset φSij depends on the output signal A1 ... Am by which the transmit signal contribution was supplied and on the transmit signal S1 ... Sk to which the transmit signal contribution contributes.

As explained above, it is frequently the case that one of the output signals A1 ... Am is a sinusoidal alternating signal and the other output signal A1 ... Am has the value zero. Preferably the antenna matrix 10 in this case distributes the non-zero output signal A1 ... Am to the transmit signals S1 ... Sk such that the transmit signals S1 ... Sk have a uniform amplitude S. The transmit signals S1 ... Sk can have the same phase for one of the output signals A1 ... Am. For all other of the output signals A1 ... Am the transmit signals S1 ... Sk have phase offsets which are determined by the corresponding contribution phase offset φSij.

Like the output matrix 4, the antenna matrix 10 preferably performs an orthogonal transformation of the output signals A1 ... Am. In particular the antenna matrix 10 can be embodied in the same manner as the output matrix 4, i.e. can be structured and dimensioned in the same way.

It is possible for the antenna matrix 10 to have as many in-puts as there are output signals A1 ... Am able to be fed to it. Alternatively the antenna matrix 10 can have more inputs than there are output signals A1 ... Am able to be fed to it. In this case it is possible in accordance with FIG. 5 for at least one of the inputs not used for feeding the output signals A1 ... Am to be terminated via a resistor 11, for which the resistance value corresponds to the surge impedance of the input concerned.

It is possible for the transmit arrangement 8 to be used exclusively for transmitting signals. In this case preferably all inputs of the antenna matrix 10 which are not used for supplying the output signals A1 ... Am are terminated via a corresponding resistor 11 in each case.

The transmit arrangement 8 can alternatively be used in mixed mode. In this case receive signals E'1 ... E'k are able to be received by the transmit antennas 9 in accordance with FIG. 6. The receive signals E'1 ... E'k are able to be fed from the transmit antennas 9 to the antenna matrix 10. In this case a number k of response signals R1 ... Rk are able to be output by the antenna matrix 10.

Figure 6:
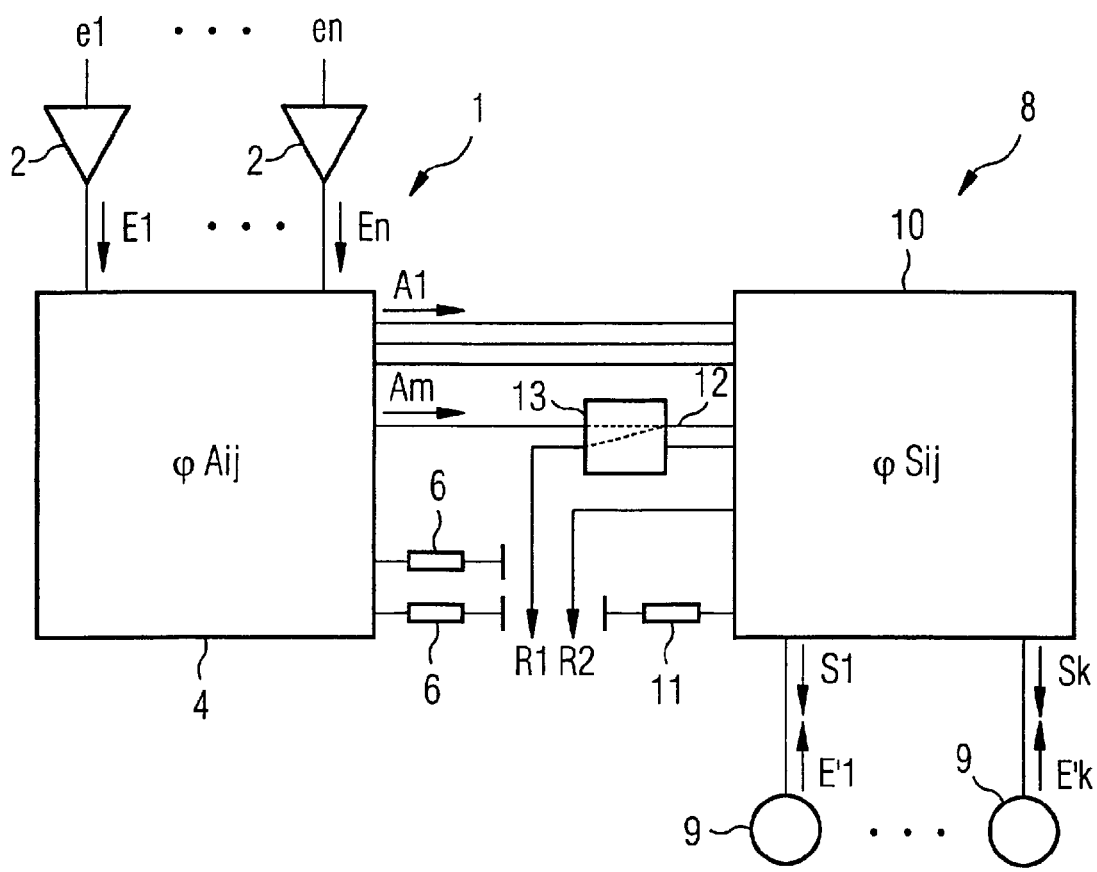
FIG. 6 schematically illustrates a further embodiment of a transmit arrangement embodying an amplifier device in accordance with the present invention.

It is possible for the signal flow of the receive signals E'1 ... E'k to be handled separately within the antenna matrix 10 from the signal flow of the output signals A1 ... Am. It is however alternatively possible to use the antenna matrix 10 bidirectionally. In this case at least of one of the response signals R1 ... Rk can be output via one of the inputs of the antenna matrix 10. In FIG. 6 this is shown for the response signals R1 and R2.

In accordance with FIG. 6 it is possible for the input, via which one of the response signals R1 ... Rk is output not to be used for supplying the output signals A1 ... Am. In FIG. 6 this is the case for the response signal R2. In accordance with FIG. 6 it is alternatively possible for at least one of the response signals R1 ... Rk to be able to be output via one of the inputs which is also used for feeding the output signals A1 ... Am. In FIG. 6 this is the case for the response signal R1.

The output signals A1 ... Am fed to the antenna matrix 10 are fed to the antenna matrix 10 via lines 12. The use of a line 12 both for feeding one of the output signals A1 ... Am and also for obtaining one of the response signals R1 ... Rk is especially made possible by a signal switch 13 (e.g. a switch-over device or a suitable hybrid) being arranged in the relevant line 12, by means of which the relevant response signal R1 ... Rk can be fed from the relevant line 12.

The transmit arrangement 8 described above can especially be used for sending out magnetic resonance excitation signals. In this case the transmit antennas 9 are embodied for sending out the magnetic resonance excitation signals. For example the transmit antennas 9 can be the rods of a so-called birdcage resonator. FIG. 7 shows a typical embodiment of an inventive overall arrangement for the typical case in which the Birdcage resonator features eight rods 9. The embodiment especially takes into consideration that only transmit signals S1 ... Sk which are polarized in the same direction or at least contain a corresponding circular polarized signal component are worth-while for magnetic resonance applications.

The inventive embodiments described above are essentially loss-free. The output matrix 4, the input matrix 5 and the antenna matrix 10 in particular are purely passive and essentially loss-free. Because of the orthogonality of the matrices 4, 5, the complete sum of the amplifier powers can be fed in any given ratio at least essentially loss-free into the transmit antennas 9. No power dissipation or barely any power dissipation arises in the resistors 6, 7. The overall circuit structure is further simplified by the matrices 4, 5, 10 not having to be switched. Instead these can be permanently wired. The amplifiers 2 can be further dimensioned such that the total of the maximum power able to be delivered by the amplifiers 2 corresponds to the total of the power able to be delivered to the transmit antennas 9, and this is independent of whether at a given point in time the transmit antennas 9 are to be operated only in a single mode or a number of modes.

Although modifications and changes may be suggested by those skilled in the art, it is the intention of the inventors to embody within the patent warranted hereon all changes and modifications as reasonably and properly come within the scope of their contribution to the art.

We claim as our invention:

1. An amplifier device comprising:
   a plurality of amplifiers, each of said amplifiers having an amplifier input supplied with an input signal and an amplifier output at which the input signal supplied thereto is emitted an amplified input signal;
   an output matrix having a plurality of output matrix inputs respectively connected to said amplifiers, each output matrix input being supplied with the amplified input signal from the amplifier connected thereto, and said output matrix comprising a plurality of output matrix outputs respectively corresponding to said plurality of output matrix inputs, each of said output matrix outputs emitting an output signal, and said output matrix outputs forming respective outputs of said amplifier device;
   said output matrix causing each of said amplified input signals to supply an output signal contribution to each of said output signals with each of said output signal contributions having an output-side contribution phase offset relative to the amplified input signal at the output matrix input corresponding to the output matrix output at which the output signal is present, each output-side contribution phase offset being dependent on each amplified input signal that includes a contribution to that output signal, as well as being dependent on that output signal; and
   each of said amplifiers producing an amplified input signal that is a sinusoidal alternating signal, with the respective amplified input signals produced by the respective amplifiers being uniform in amplitude and frequency and respectively having phase offsets relative to each other, with one of said amplified input signals having a signal phase offset that compensates for the output-side contribution phase offset of one of said output signals at one of said output matrix outputs corresponding to the output matrix input to which said one of said amplified input signals is supplied, and the respective output-side contribution phase offsets produced by said output matrix being set to produce respective output signal contribution components at a remainder of said output signals that, in total, compensate for each other.

2. An amplifier device as claimed in claim 1 wherein said output matrix sets the respective output-side contribution phase offsets to allow a determination to be made from said signal phase offsets as to which of said plurality of output signals is said one of said output signals.

3. An amplifier device comprising:

a plurality of amplifiers, each of said amplifiers having an amplifier input supplied with an input signal and an amplifier output at which the input signal supplied thereto is emitted an amplified input signal;

an output matrix having a plurality of output matrix inputs respectively connected to said amplifiers, each output matrix input being supplied with the amplified input signal from the amplifier connected thereto, and said output matrix comprising a plurality of output matrix outputs respectively corresponding to said plurality of output matrix inputs, each of said output matrix outputs emitting an output signal, and said output matrix outputs forming respective outputs of said amplifier device;

said output matrix causing each of said amplified input signals to supply an output signal contribution to each of said output signals with each of said output signal contributions having an output-side contribution phase offset relative to the amplified input signal at the output matrix input corresponding to the output matrix output at which the output signal is present, each output-side contribution phase offset being dependent on each amplified input signal that includes a contribution to that output signal, as well as being dependent on that output signal;

an input matrix having a plurality of input matrix inputs respectively supplied with original input signals, and said input matrix comprising a plurality of input matrix outputs respectively corresponding to said plurality of input matrix inputs, said input matrix outputs being respectively connected to said amplifiers and emitting the input signal to the amplifier connected thereto; and said input matrix causing each of said original input signals to supply an original signal contribution to each of said amplifier input signals with each of said original signal contributions having an output-side contribution phase offset relative to the original input signal at the input matrix input corresponding to the input matrix output at which the amplifier input signal is present, each output-side contribution phase offset being dependent on each original input signal that makes contribution to that signal, as well as being dependent on that amplifier input signal.

4. An amplifier device as claimed in claim 3 wherein each of said original input signals is a sinusoidal alternating signal, with the respective original input signals being uniform in amplitude and frequency and respectively having phase offsets relative to each other, with one of said original input signals having a signal phase offset that compensates for the output-side contribution phase offset of one of said amplifier input signals at one of said input matrix outputs corresponding to the input matrix input to which said one of said original input signals is supplied, and wherein the respective output-side contribution phase offsets produced by said input matrix are set to produce respective amplifier input signal contribution components at a remainder of said amplifier input signals that, in total, compensate for each other.

5. An amplifier device as claimed in claim 4 wherein said input matrix operates independently of which of said original input signals is said one of said original input signals.

6. An amplifier device as claimed in claim 3 wherein said input matrix and said output matrix are internally identically configured.

7. An amplifier device as claimed in claim 3 wherein each of said input matrix inputs has a surge impedance associated therewith and wherein said plurality of input matrix inputs is larger than said plurality of original signals, thereby causing at least one of said input matrix inputs to be an unused input matrix input, and comprising a resistor connected to each unused input matrix input, said resistor having a resistance value corresponding to said surge impedance.

8. An amplifier device as claimed in claim 1 comprising:

a plurality of amplifiers, each of said amplifiers having an amplifier input supplied with an input signal and an amplifier output at which the input signal supplied thereto is emitted an amplified input signal;

an output matrix having a plurality of output matrix inputs respectively connected to said amplifiers, each output matrix input being supplied with the amplified input signal from the amplifier connected thereto, and said output matrix comprising a plurality of output matrix outputs respectively corresponding to said plurality of output matrix inputs, each of said output matrix outputs emitting an output signal, and said output matrix outputs forming respective outputs of said amplifier device;

said output matrix causing each of said amplified input signals to supply an output signal contribution to each of said output signals with each of said output signal contributions having an output-side contribution phase offset relative to the amplified input signal at the output matrix input corresponding to the output matrix output at which the output signal is present, each output-side contribution phase offset being dependent on each amplified input signal that includes a contribution to that output signal, as well as being dependent on that output signal;

each of said output matrix inputs having a surge impedance associated therewith and said plurality of output matrix inputs being larger than said plurality of amplifier input signals, thereby causing at least one of said output matrix inputs to be an unused output matrix input; and a resistor connected to each unused output matrix input, said resistor having a resistance value corresponding to said surge impedance.

9. An amplifier device as claimed in claim 1 wherein all of said amplifiers have identical amplification characteristics.

10. An amplifier device as claimed in claim 9 wherein all of said amplifiers are of an identical design and type.

11. A transmit arrangement for radio-frequency signals, comprising:

an amplifier device comprising a plurality of amplifiers, each of said amplifiers having an amplifier input supplied with an input signal and an amplifier output at which the input signal supplied thereto is emitted an amplified input signal;

an output matrix having a plurality of output matrix inputs respectively connected to said amplifiers, each output matrix input being supplied with the amplified input signal from the amplifier connected thereto, and said output matrix comprising a plurality of output matrix outputs respectively corresponding to said plurality of output matrix inputs, each of said output matrix outputs emitting an output signal, and said output matrix outputs forming respective outputs of said amplifier device; and said output matrix causing each of said amplified input signals to supply an output signal contribution to each of said output signals with each of said output signal contributions having an output-side contribution phase offset relative to the amplified input signal at the output matrix input corresponding to the output matrix output at which the output signal is present, each output-side contribution phase offset being dependent on each amplified input signal that includes a contribution to that output signal, as well as being dependent on that output signal;

a plurality of transmit antennas;

an antenna matrix having a plurality of antenna matrix inputs respectively connected to said amplifier device outputs, each antenna matrix input being supplied with the output matrix output signal from the amplifier device output connected thereto, and said antenna matrix comprising a plurality of antenna matrix outputs respectively corresponding to said plurality of antenna matrix inputs, each of said antenna matrix outputs emitting an antenna matrix output signal, and said antenna matrix outputs being respectively connected to said transmit antennas; and said antenna matrix causing each of said output matrix output signals to supply an antenna matrix output signal contribution to each of said antenna matrix output signals with each of said antenna matrix output signal contributions having a transit-side contribution phase offset relative to the output matrix output signal at the antenna matrix input corresponding to the antenna matrix output at which that antenna matrix output signal is present, said transit-side contribution phase offset being dependent on each output matrix output signal that makes a contribution to that antenna matrix output signal, as well as being dependent on that antenna matrix.

12. A transmit arrangement as claimed in claim 11 wherein said antenna matrix, when one of said output signals of said output matrix is a sinusoidal alternating signal and all other output signals of said output matrix have a value of zero, produces said transmit-side phase offsets to cause said transmit signals to respectively have amplitudes that are uniform.

13. A transmit arrangement as claimed in claim 11 wherein said antenna matrix and said output matrix are internally identically configured.

14. A transmit arrangement as claimed in claim 11 wherein said antenna matrix has more antenna matrix inputs than said amplifier device has amplifier device outputs, thereby causing at least one of said antenna matrix inputs to be an unused antenna matrix input.

15. A transmit arrangement as claimed in claim 14 wherein each of said antenna matrix inputs has a surge impedance associated therewith, and comprising a resistor connected to each unused antenna matrix input, said resistor having a resistance value corresponding to said surge resistance.

16. A transmit arrangement as claimed in claim 14 wherein each of said transmit antennas also is configured to receive a reception signal, and wherein the respective reception signals are fed by the respective transmit antennas to said antenna matrix, said antenna matrix producing a plurality of reception output signals.

17. A transmit arrangement as claimed in claim 16 wherein said antenna matrix emits at least one of said response signals at said at least one unused antenna matrix input.

18. A transmit arrangement as claimed in claim 16 wherein antenna matrix emits said response signals respectively at said antenna matrix inputs that are also connected to said amplifier device outputs.

19. A transmit arrangement as claimed in claim 18 comprising a switch at each of said antenna matrix inputs that is actuatable to disconnect that antenna matrix input from the amplifier device output connected thereto, to allow the respective reception signal at that antenna matrix input to be tapped.

20. A transmit arrangement as claimed in claim 11 wherein said transmit antennas are configured as antennas that emit magnetic resonance excitation signals.

* * * * *